United States Patent [19]
Madhavan et al.

[11] Patent Number: 5,675,545
[45] Date of Patent: Oct. 7, 1997

[54] METHOD OF FORMING A DATABASE THAT DEFINES AN INTEGRATED CIRCUIT MEMORY WITH BUILT IN TEST CIRCUITRY

[75] Inventors: Rajeev Madhavan, Fremont; Barginderpal S. Gill, Monte Sereno, both of Calif.

[73] Assignee: Ambit Design Systems, Inc., Sunnyvale, Calif.

[21] Appl. No.: 526,012

[22] Filed: Sep. 8, 1995

[51] Int. Cl.$^6$ .................................................. G11C 13/00
[52] U.S. Cl. ............................................ 365/201; 371/22.5
[58] Field of Search ........................... 365/201; 371/21.2, 371/21.3, 22.5

[56] References Cited

U.S. PATENT DOCUMENTS

| | | | |
|---|---|---|---|
| 4,433,413 | 2/1984 | Fasang | 371/25 |
| 4,996,691 | 2/1991 | Wilcox et al. | 371/68.1 |
| 5,138,619 | 8/1992 | Fasang et al. | 371/21.1 |
| 5,311,520 | 5/1994 | Raghavachari | 371/21.6 |
| 5,325,367 | 6/1994 | Dekker et al. | 371/21.1 |
| 5,349,587 | 9/1994 | Nadeau-Dostie et al. | 371/22.3 |
| 5,469,443 | 11/1995 | Saxena | 371/21.3 |
| 5,471,482 | 11/1995 | Byers et al. | 371/21.2 |

*Primary Examiner*—David C. Nelms
*Assistant Examiner*—Michael T. Tran
*Attorney, Agent, or Firm*—Majestic, Parsons, Siebert & Hsue

[57] ABSTRACT

An integrated circuit random access memory includes a built in self-test ("BIST") system that has separate address counters and scan registers positioned adjacent each of a plurality of memory blocks. A controller is included as part of the test system for generating test patterns, providing an output that indicates whether the memory blocks have passed the test, and for performing other test control functions. The scan registers can also be alternatively used for testing the memory with external test vectors. The test system is designed into an integrated circuit by providing various database files of test system blocks from which a combination may be made to meet the requirements of various types of memory modules and provide a desired BIST algorithm. In designing such a circuit, the designer specifies certain information, such as the memory type to be used, the BIST algorithm to be implemented, and similar high level information. The appropriate database files are then automatically selected and connections between them defined, in a hierarchical way, by software processing. In this processing, small blocks are combined into larger blocks having specified external connections, and then these larger blocks are combined by defining how their external connections are connected together and externally. If more than two levels of blocks are being used, this process is continued. The result is a database defining a customized integrated circuit memory with BIST.

3 Claims, 9 Drawing Sheets

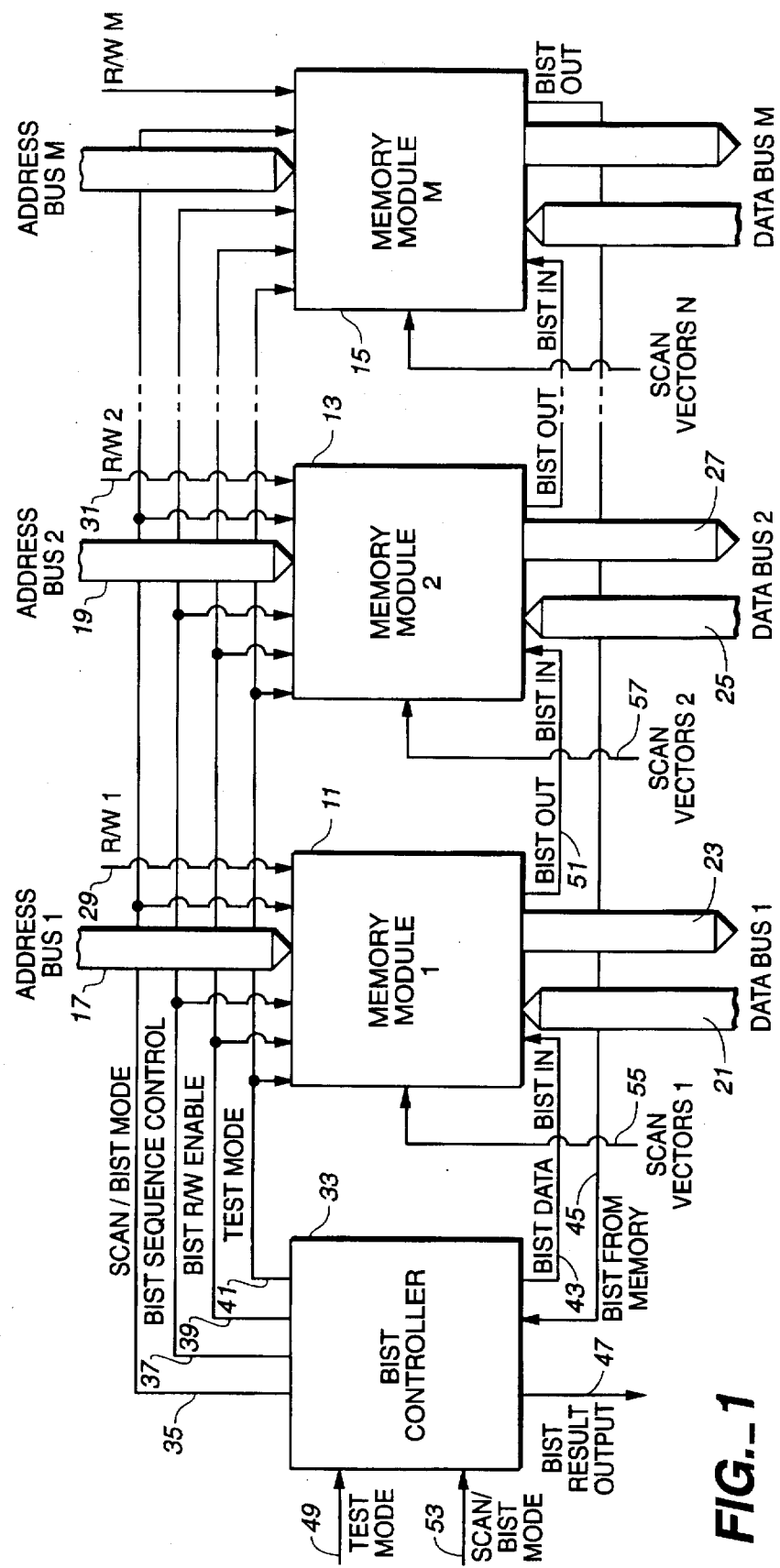
FIG._1

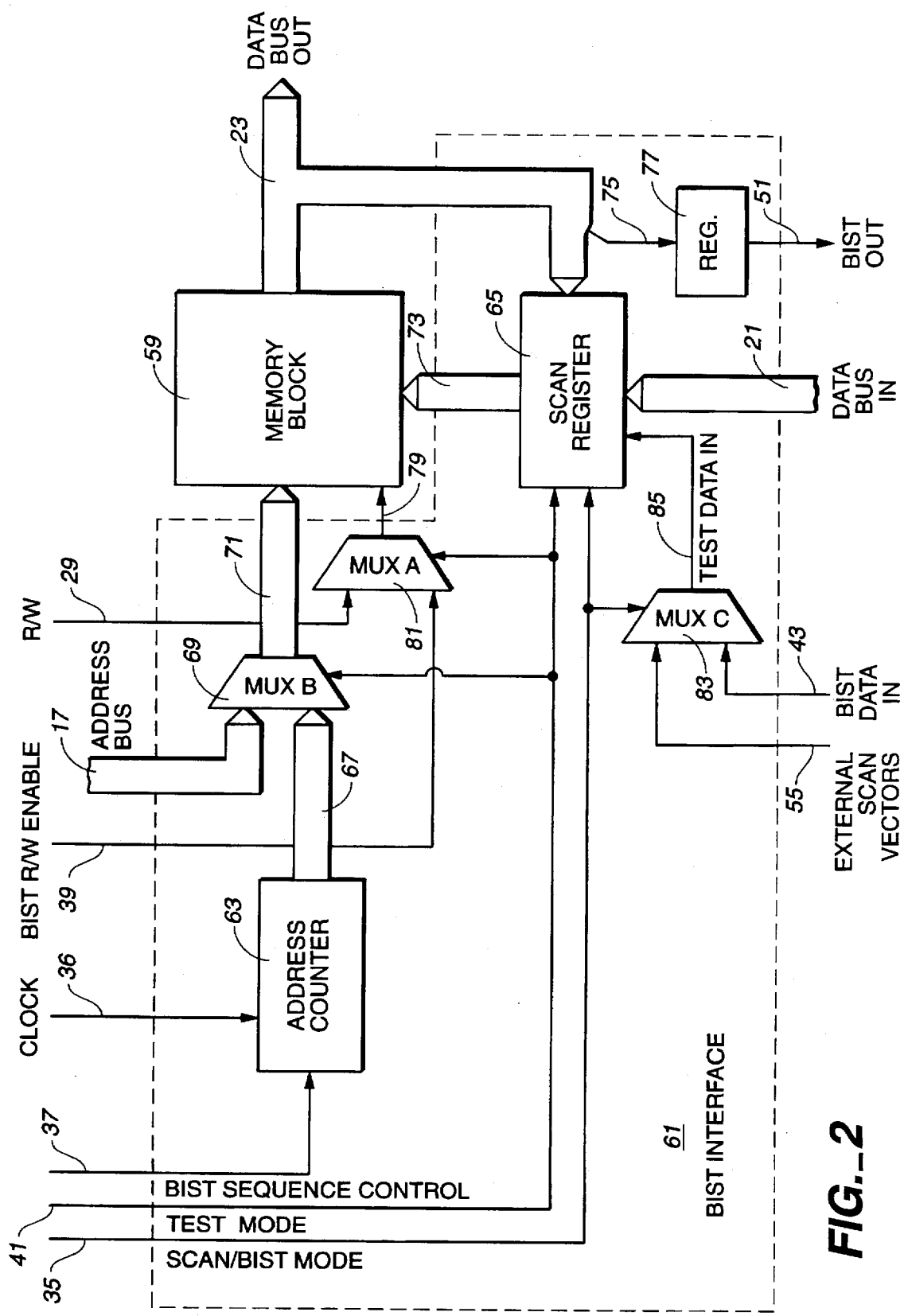
FIG._2

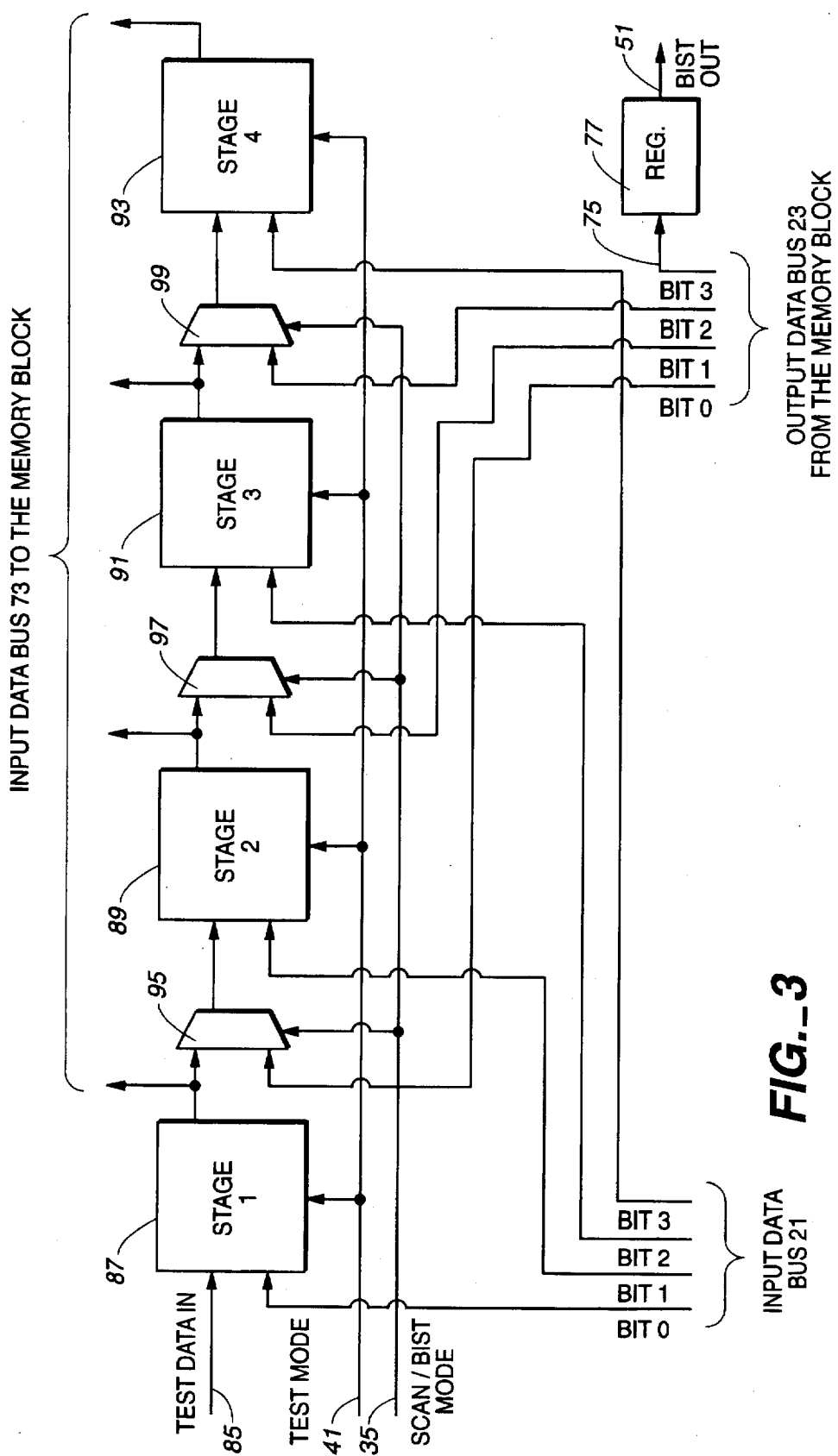
FIG._3

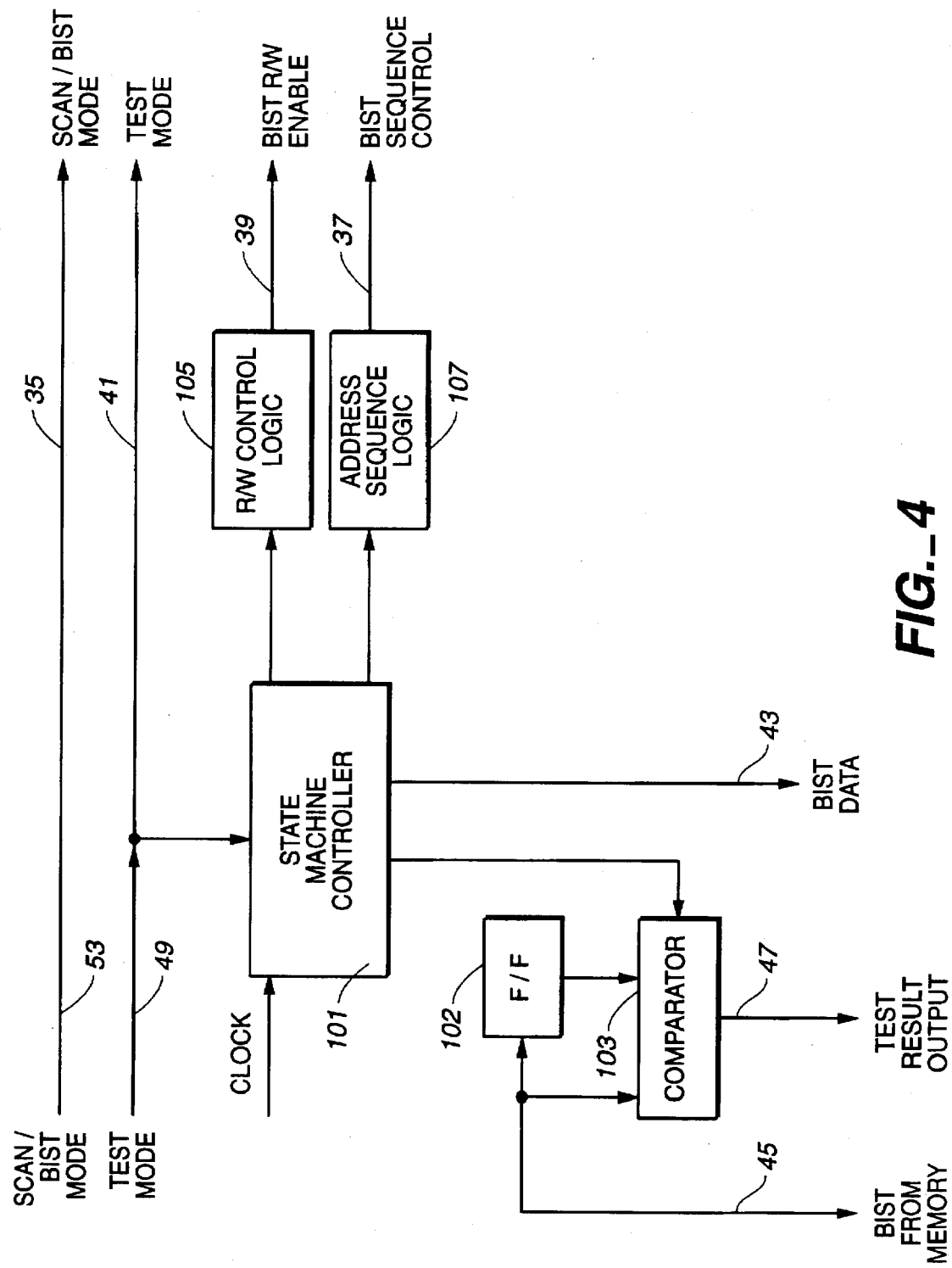
FIG._4

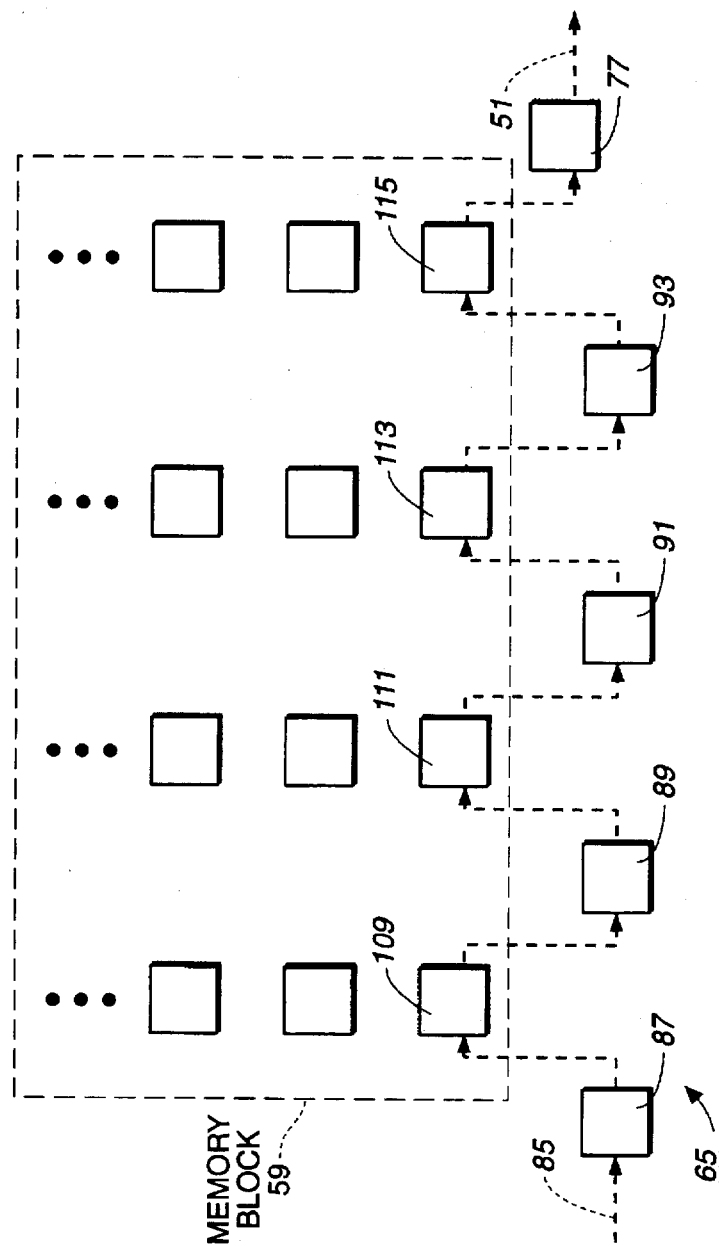
FIG._6
FIG._5

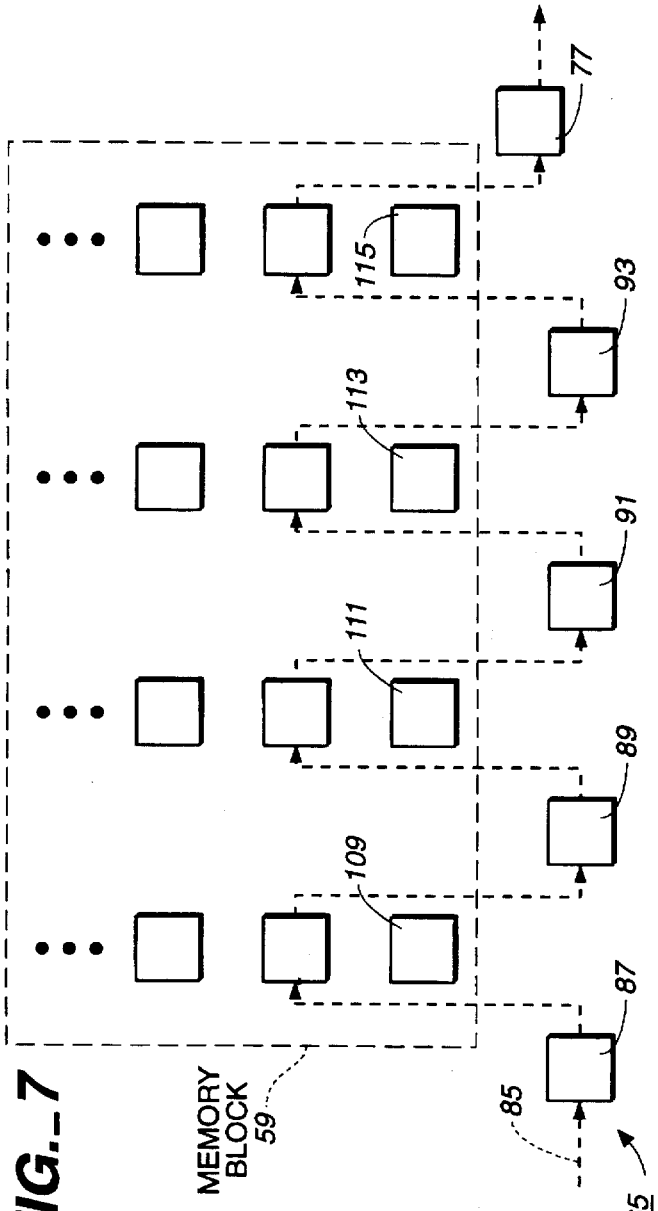
FIG._7
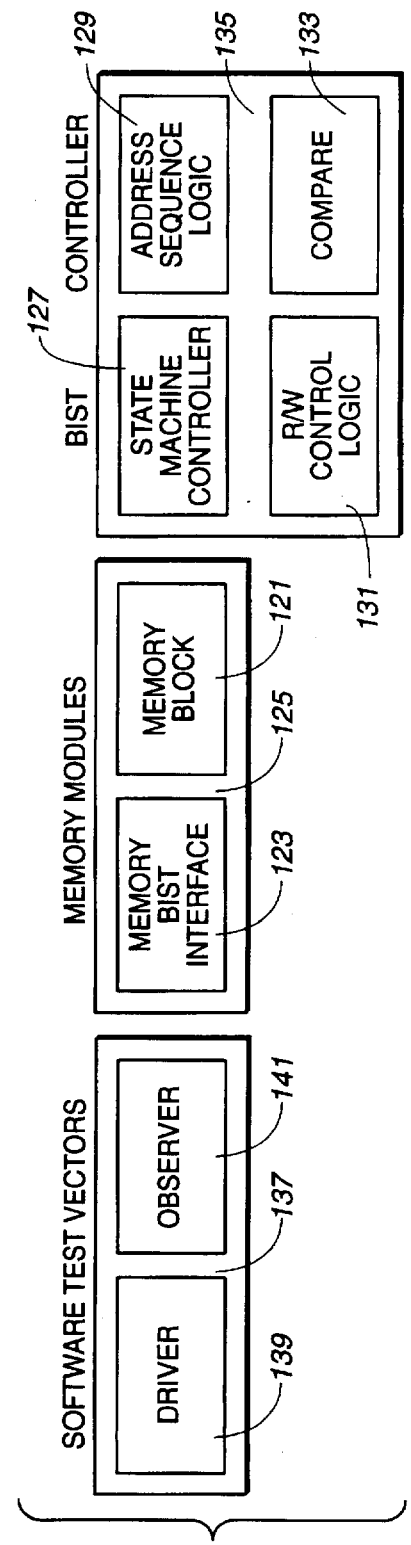
FIG._8

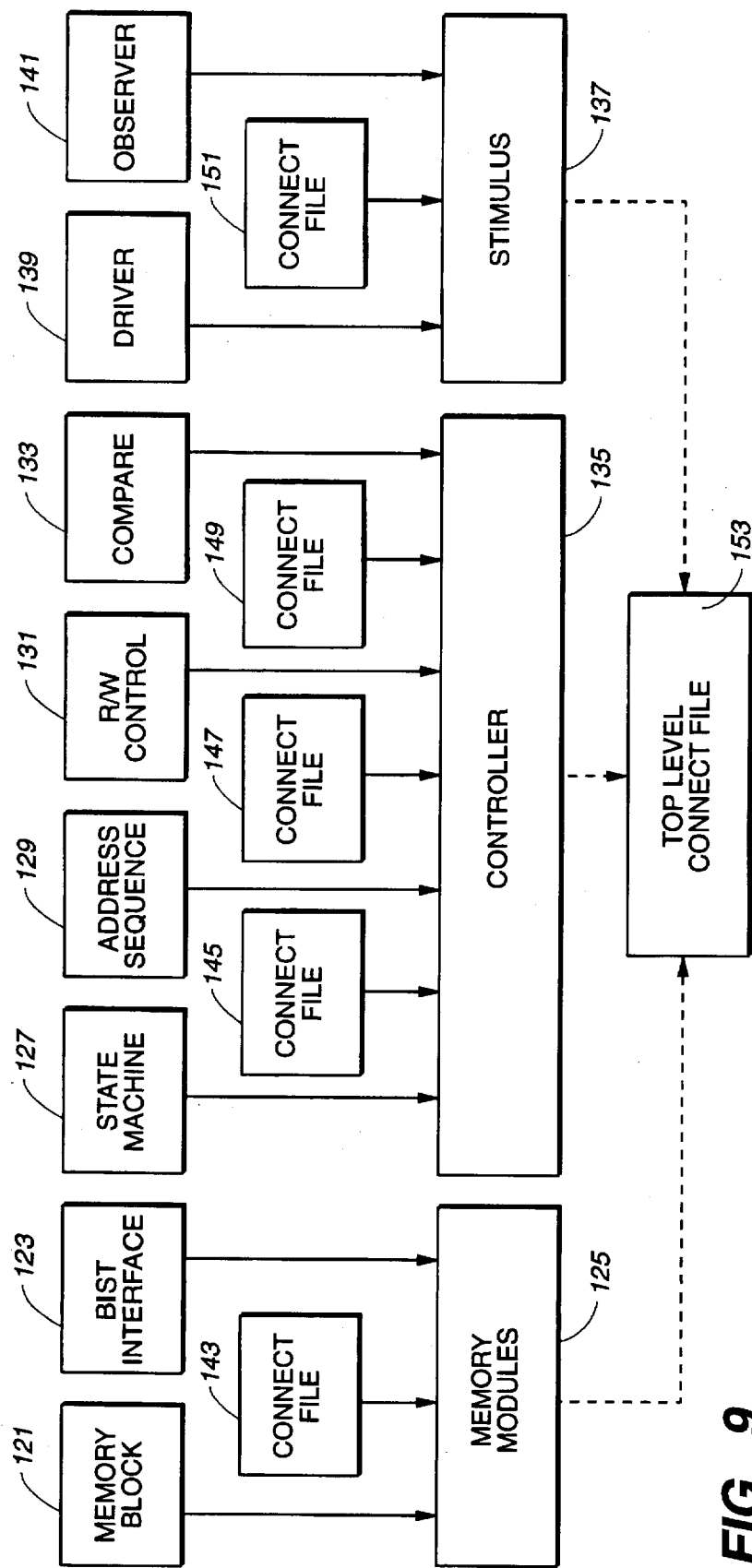
FIG._9

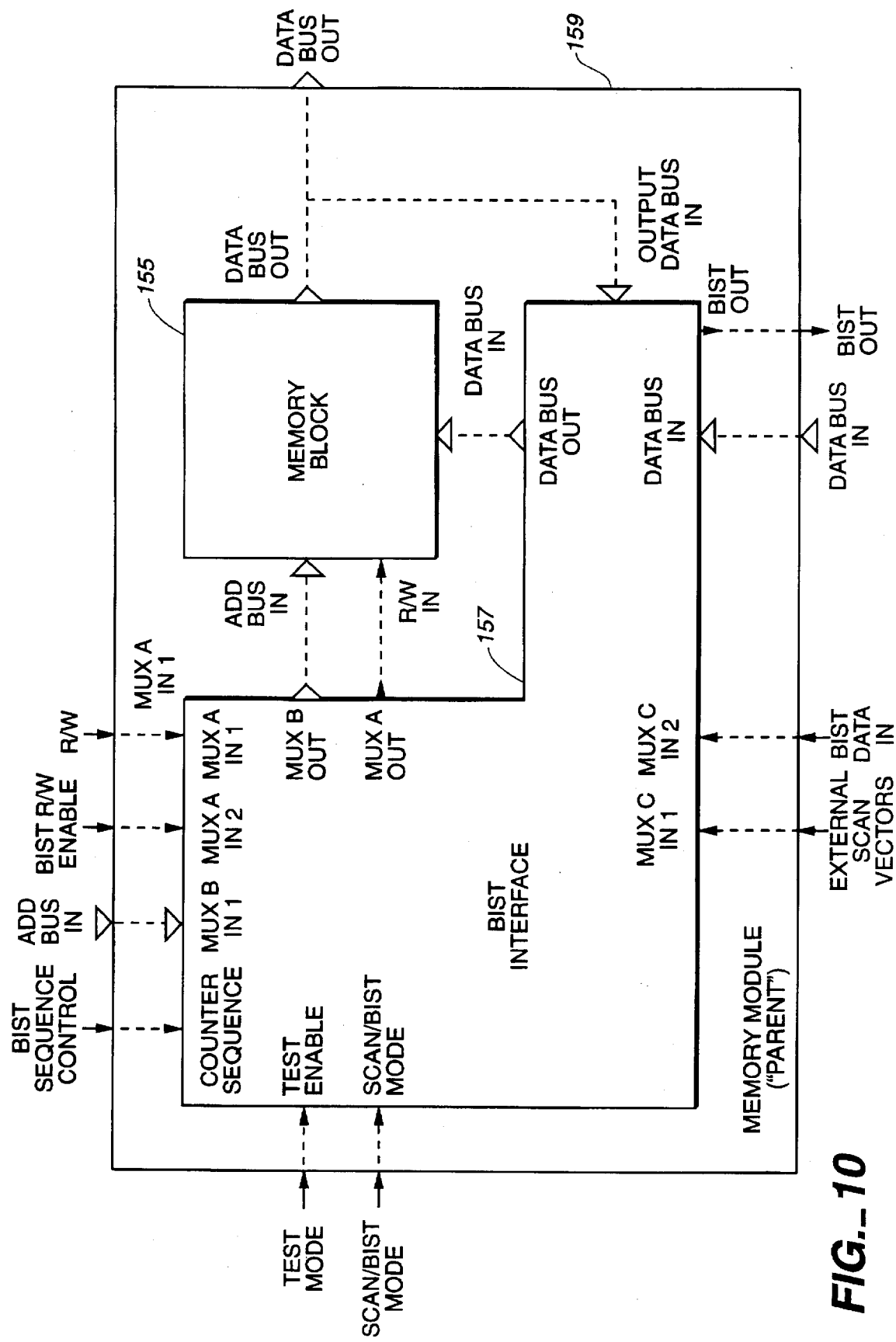
FIG._10

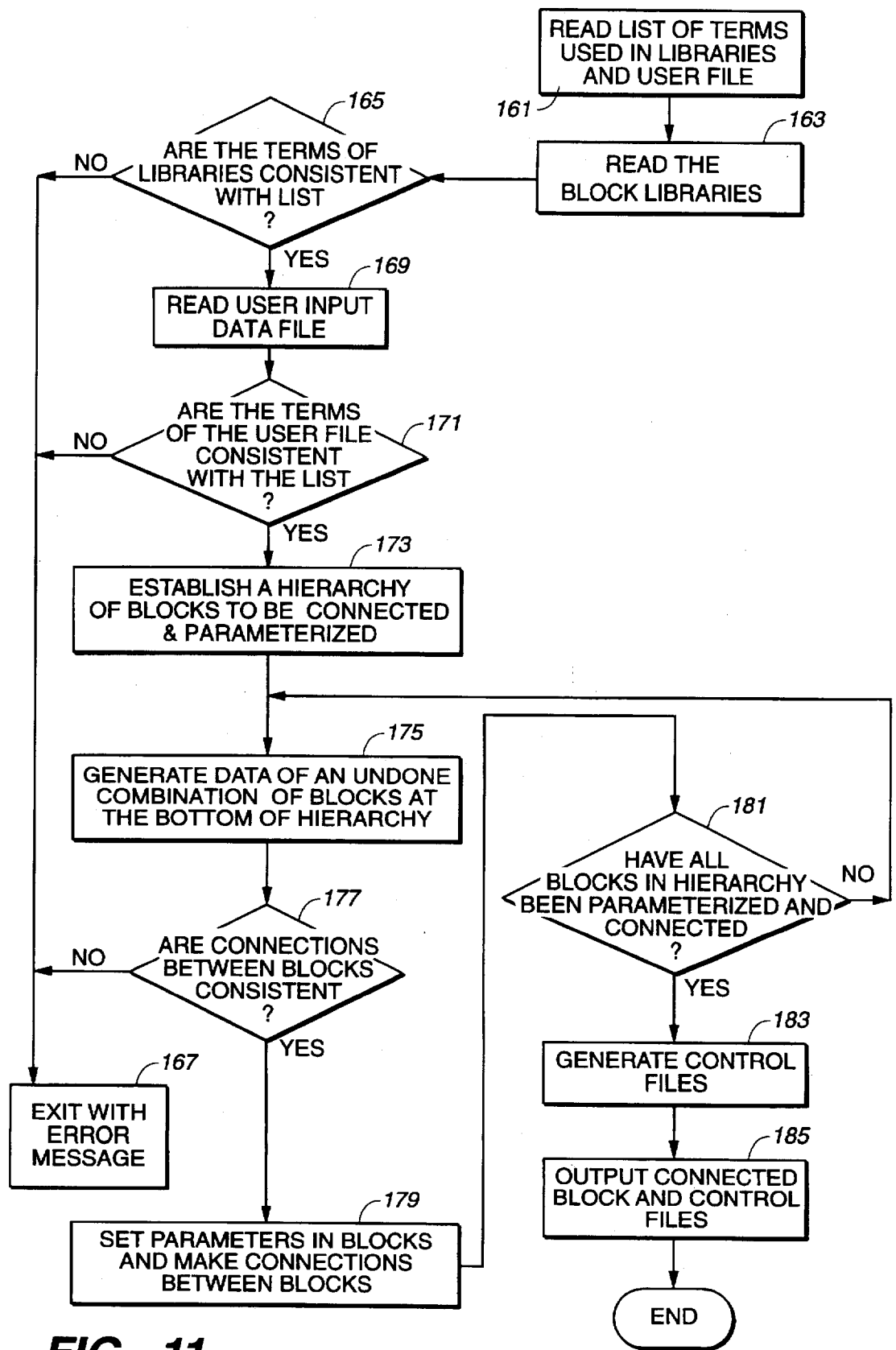
FIG._11

1

METHOD OF FORMING A DATABASE THAT DEFINES AN INTEGRATED CIRCUIT MEMORY WITH BUILT IN TEST CIRCUITRY

BACKGROUND OF THE INVENTION

This invention relates to integrated circuit memories having built-in self-testing ("BIST") systems, and computer implemented techniques for configuring and developing a database from which a specific integrated circuit memory test scheme can be made.

Semiconductor memories are often provided with a BIST system included on the same integrated circuit chip. Such systems typically include a test pattern generator and a comparator for determining whether the memory has passed the test. The test system is used primarily by manufacturers of static random access memories (SRAMs), read only memories (ROMs), context addressable memories (CAMs), programmable logic arrays (PLAs), and similar products, to initially test each circuit chip before shipping it to customers. Even though the test circuitry occupies a significant amount of integrated circuit area, suppliers have found it to be more economical than testing each chip entirely by an external tester. The internal test system does not significantly increase the number of pins necessary, generally requiring only one pin for initiating the test and another pin for providing a pass/fail result of the test. This may be combined with a test access port controller according to standard 1149.1 of the Institute of Electrical and Electronic Engineers (IEEE) for testing the entire chip.

As the capacity of memory circuits has increased, so have the size, signal delays and complexity of the BIST circuitry. Several independent memory arrays are often included on a chip, each with its own address, data and control/status bus pins. The BIST circuitry becomes complex and large in these situations, primarily because much of it has to be reproduced for each of the memory blocks.

Therefore, it is a primary object of the present invention to provide a BIST system for these and similar products that is less complex and requires less chip area, including less routing overhead, than does a system implemented according to existing BIST techniques.

It is also an object of the present invention to provide the ability to alternatively apply external test vectors to the chip without having to include extra elements to do so.

There are many companies which manufacture semiconductor memories and provide databases for use by themselves and others to include their memory modules as part of various application specific integrated circuit (ASIC) products. Different ASIC foundries offer many different types of memory systems. There are also many different test algorithms that are favored by different companies for execution by BIST systems. It thus becomes a labor intensive effort to implement a particular type of memory, from a given company, with a BIST system that also implements a desired test algorithm.

Therefore, it is also a primary object of this invention to provide design methodologies and computer software processing techniques for providing specific implementations of an integrated circuit memory with a BIST system that are simple and efficient to use.

It is also a more general object of this invention to provide an improved technique of assembling databases of complex circuit blocks that are being combined on a single integrated circuit chip to form a specific system architecture.

SUMMARY OF THE INVENTION

These and additional objects are accomplished by the present invention, wherein, briefly and generally, specific ones of a plurality of circuit block data files are interconnected by separately maintained connection files in order to implement blocks of an integrated circuit. The interconnections between circuit blocks are automatically defined hierarchically, through use of implementing software. That is, connections between two or more of the smallest circuit blocks are first specified in a manner to also define external connections of a parent block that contains the smaller circuit blocks. Two or more such parent blocks are then combined, if enough layers of circuit blocks are involved, to define interconnections of parent blocks within grandparent blocks, also having their external connections defined. The individual circuit block data files, which define the functionality or structure of their respective blocks, need not be modified during this process in order to effect the interconnections but certain parameters may be set within user defined files as part of the process. The overlying interconnection data files define how these blocks are connected together. A combination of the block data files, after any necessary parameters are set, and the interconnection data files together provide a complete description of the blocks of an integrated circuit that implement a specific architecture. An example is BIST for memories.

For a memory with BIST, the designer selects a data file for a desired type of memory from a particular manufacturer. The memory block data file is combined with a data file of a BIST interface, through a separate data file that specifies its interconnections and the external connections of a resulting parent block. Since the contents of the circuit block data files do not need to be modified, the skill level of the designer who is able to design the integrated circuit, but is not familiar with BIST, need not be as high. The designer primarily selects the correct databases to be combined together and sets any necessary parameters of the individual databases, the implementing software doing the rest. A test controller parent block is similarly formed from data files of two or more specific circuit blocks. An example is to form the test controller parent block from a state machine test pattern generator block, a test result comparator block and one or more blocks that control the operation of the BIST interface blocks.

According to another aspect of the present invention, an integrated circuit chip includes a plurality of memory blocks, each of which includes a BIST interface block immediately adjacent it that contains an address counter and a scan register for that memory block. A single test controller is included on the circuit chip for multiple memory blocks, only one test controller preferably being used. The circuit chip area that would otherwise be used for additional test controllers is thus reduced. The test controller is connected to each of the BIST interface blocks by only a few lines, thus also saving a considerable amount of area that might otherwise be occupied by address bus, data bus, and/or control/status bus lines of the various memory blocks.

Additional objects, advantages and features of the various aspects of the present invention are set forth in the following description of its preferred embodiments, which description should be taken in conjunction with the accompanying drawings.

BRIEF DESCRIPTION OF THE DRAWINGS

FIG. 1 illustrates the primary components of a multiple memory integrated circuit chip having a BIST controller included thereon;

FIG. 2 shows an example memory module of FIG. 1;

FIG. 3 is a schematic diagram of the scan register block of FIG. 2;

FIG. 4 is a block diagram of the BIST controller block of FIG. 1;

FIGS. 5 and 6 illustrate one series of steps and operation in a self-test mode of one of the memory modules of the system of FIGS. 1-4;

FIG. 7 illustrates a subsequent series of steps to test a memory module of the system of FIGS. 1-4;

FIG. 8 schematically illustrates the organization of data files of various circuit blocks implemented by the memory system of FIGS. 1-4;

FIG. 9 schematically outlines the various circuit block data files that are utilized to form the memory system of FIGS. 1-4;

FIG. 10 illustrates in a different way the hierarchical combination of circuit block data files that define one of the memory modules of the system of FIG. 1; and FIG. 11 is a flowchart that illustrates operation of a computer software processing tool that combines circuit block data files in a hierarchical manner.

DESCRIPTION OF THE PREFERRED EMBODIMENTS

Referring initially to FIG. 1, a single integrated circuit chip includes at least two memory modules 11 and 13 but may contain up to M separate modules, the last of which is illustrated by a block 15. The memory modules can contain the same type of memory, or different types. Each module has its own address bus, such as bus 17 for the module 11 and the bus 19 for the module 2, which are connected to separate groups of pins of the integrated circuit chip. Similarly, each module has its own data bus, an incoming data bus 21 and an outgoing data bus 23 being shown for the memory module 1. Of course, the memory modules can use a bi-directional data bus instead. Similarly, an input data bus 25 and an output data bus 27 are provided for the memory module 2. Each of the memory modules also has the usual number of status and control lines extending to separate pins of the circuit chip, one of which may be a read/write line 29 illustrated for memory module 1 and a read/write line 31 being illustrated for memory module 2.

As described below with respect to FIG. 2, each of the memory modules includes a block of memory and associated BIST test interface circuitry. The circuit chip also contains a controller 33 that communicates with the BIST test interface circuits of each of the memory modules over various circuits. This includes individual control lines 35, 37, 39 and 41. One function of the controller 33 is to generate a serial bit test pattern and this is generated in a line 43. After passing through one or more of the memory modules, this data is serially routed through a line 45 back to the controller 33. A comparator in the controller 33 gives an indication in a line 47 as to whether the serial bit test pattern received back by the controller is the same as earlier sent out to one or more memory modules. The line 47 extends to an external circuit pin. Another circuit pin is connected to a control line 49 to allow a user to switch the circuit chip into a test mode.

The test data in the line 43 is shown in FIG. 1 to be connected only to the memory module 11. The test data exits the memory module 11 in an output line 51, which is then connected to the test data input of the memory module 13, and so forth along the line for the number of memory modules that exist. Alternatively, the test data can be applied to the memory modules one at a time, the test bit pattern output of each of the modules then being connected back to the BIST controller for evaluation.

In addition to having the BIST capability, it is sometimes desired to also be able to test the memory circuits by externally generated test vectors. As described more fully below, the illustrated embodiment has that capability. In response to a control signal in a line 53 from an external pin, the test circuitry adapts the memory modules to serially receive external test bit patterns. The memory module 11 receives such patterns through a line 55, and the memory module 13 through a line 57.

Referring to FIG. 2, each of the memory modules of FIG. 1 includes a block 59 of memory cells. This is a basic, core memory system for which numerous data files exist from various ASIC manufacturers. Added to such a standard memory block is a BIST interface 61 that includes, as its primary elements, an address counter 63 and a scan register 65. The address counter 63 increments through various counts in a local bus 67 in response to a clock signal in a line 36 from the controller 33. A counting cycle is initiated by a control signal in the line 37. A multiplexor 69 responds to a control signal in a test mode line 41 to connect an address bus 71 of the memory block 59 to either the external address bus 17 or the local bus 67. Thus, the state of the test mode line 41 determines whether the memory module operates normally as a memory, in which case the memory block 59 is connected to the external address bus 17, or in a BIST mode, in which case the memory block 59 receives addresses from the address counter 63.

A significant advantage or providing a separate address counter in the BIST interface circuitry immediately adjacent the memory block is that extensive runs of an address bus for the purpose of testing the memory blocks is unnecessary. The local address bus 67 can be made extremely short, only a single control line 37 and clock line 36 being necessary to control the addresses presented to the memory block during testing. Similarly, the scan register 65 is positioned proximate to the memory block 59 in the path of its input data bus. The external input data bus 21 is connected as an input to the scan register 65, whose output is connected to an input data bus 73 of the memory block 59. The output data bus of the memory block 59 is connected directly to the external output data bus 23 and also as another input to the scan register 65. One line 75 of the output data bus 23 provides the BIST test bit pattern output of the memory module, a single bit register stage 77 being optionally interposed in that output path. The output of the register stage 77 is the BIST test bit pattern output line 51.

A read/write control input 79 to the memory block 59 is connected by a multiplexor 81, in response to the test mode signal in line 41, to either the external read/write control line 29 for that memory block or the internal BIST read/write enable line 39. With the ability to also accept external serial scan vectors, another multiplexor 83 responds to a control signal in a line 35 that designates whether the internal BIST system or external test vectors are being utilized. That is, a test data input line 85 to the scan register 65 receives either the BIST data in line 43 that is generated by the on-board controller 33 or to the external line 55 for receiving an external test vector.

Referring to FIG. 3, the scan register 65 of FIG. 2 is schematically illustrated. Four flip-flop stages 87, 89, 91 and 93 are shown. The description of the scan register with respect to FIG. 3, and operation of the BIST system with respect to FIGS. 5-7, assume a four bit data bus for simplicity in explanation. Of course, the data bus as actually used would be much larger than this, at least 16 or 32 bits wide, but the principle of operation is the same. In between the flip-flop stages 87-93 are multiplexors 95, 97 and 99, that are included in order to also accommodate external test vectors. If it is not desired to be able to receive and use external test vectors, these multiplexors 95-99 are omitted. There is then no direct connection between the individual flip-flop stages 87-93.

Each of the flip-flop stages 87-93 has two inputs, one of which is selected to be received by its internal flip-flop circuit by a state of the test mode line 41. In one state, when the memory module is operating as a normal memory, a unique one of the lines of the input data bus 21 is applied as an input to each of the flip-flop stages 87-93. An output of each of the stages provides one of the lines of the input data bus 73 to the memory block 59. When the signal and control line 41 indicates that the memory module is to operate in a test mode, the first flip-flop stage 87 receives as an input the test data input line 85. The remaining stages 89, 91 and 93 receive as an input the output of the respective multiplexors 95, 97 and 99. If the control signal in the line 35 indicates that the BIST mode is being used, those three stages are connected to the first three lines of the output data bus 23. The fourth line 75 provides the output test bit pattern of the memory module. Alternatively, when the control signal on the line 35 indicates that the operation in a SCAN test mode, external bit patterns are serially received in line 85 at the input to the first flip-flop stage 87, while the other three stages 89, 91 and 93 have their inputs connected directly to the outputs of the immediately preceding stage through one of the respective multiplexors 95-99.

The internal BIST controller 33 of FIG. 1 is illustrated further in FIG. 4. The BIST bit pattern is generated in line 43 by a state machine 101. A particular test bit pattern is generated in the line 43 in accordance with the structure of the state machine 101. In order to execute a preferred BIST algorithm, a comparator 103 receives both the BIST data from the memory in the line 45 and a delayed version of that BIST data through a single register stage 102. The comparator 103 thus compares a current bit of the BIST data in the line 45 with an immediately preceding bit. The controller also contains logic 105, which responds to signals from the state machine 101, to generate the appropriate read/write enable signals in the line 39 during a BIST operation. Similarly, logic circuits 107 respond to timing signals from the state machine 101 to generate signals in the line 37 to control the address counters in each of the BIST interfaces of the memory modules.

Referring to FIG. 5, operation of the memory system of FIGS. 1-4 during a BIST operation, according to the preferred BIST algorithm, will be generally explained. The memory block 59 is shown to have a two-dimensional array of individual bit cells, such as a row of cells 109, 111, 113 and 115. The dashed line of FIG. 5 shows the path of travel of a serial BIST bit pattern when that row of cells is addressed by the address counter 63 of the BIST interface that is positioned adjacent the memory block. Each addressed memory cell takes on the state of the scan register stage to which it is connected. For example, the cell 109 will be in the same state as the scan register stage 87, the memory cell 111 the state of the stage 89, and so on, in a master/slave relationship. The state machine 101 generates, while the address counter remains at that particular count, a series of 0s sufficient to fill each of the register stages of the scan register 65 and the output register 77 with 0s. This is shown in line a) of FIG. 6. In a next clock cycle, a 1 occurs in the bit stream from the state machine 101 and is loaded in the first stage 87 of the scan register 65. This is shown in line b) of FIG. 6. Similarly, three more 1s occur in the bit data stream until the contents of the registers appear as shown in line e) of FIG. 6. A series of four 0s then occurs, until the state of the registers shown in line g) of FIG. 6 exists. The BIST bit stream, in this particular example, thus continues with alternate groups of four 0s, four 1s, four 0s, and so forth.

At an appropriate point in the bit pattern, a clock signal in the line 36 increments the output of the address counter 63 to address a second row of the memory block 59, as illustrated in FIG. 7. Thus, one row of cells is tested by passing a particular serial bit stream through them, the BIST address counter incremented to address the next row, the bit pattern passed through that row, the address counter incremented in the next row, and so on until all of the memory cells of the memory block have been tested. The output register 77 becomes unnecessary if the memory block is of a type that includes such a register internal to it.

Referring back to the BIST interface 61 of FIG. 2, it should be noted that some memory block designs include a scan register as part of the memory block 59. In that case, the connections between the BIST interface 61 and the memory block 59 are those lines connecting with the scan register 65 in place of the data input bus 73. An internal scan register is provided by some memory blocks to enable testing of the block by external test vectors. What the remaining portion of the BIST interface 61 provides, along with the remaining portions of the on-chip BIST system, is the ability to perform a test of the memory when a user simply initiates the test which then automatically progresses to completion.

When an integrated circuit designer starts to design a memory chip, he or she has database files of many specific memory block designs from which to choose. The individual database files generally define a memory block in terms of the functions performed by the memory block, in a format such as a Verilog (IEEE standard 1364) or VHDL format (IEEE standard 1076.1). In addition to being faced with a large number of memory block files from which to choose, a memory circuit designer who wants to include a BIST system as part of the circuit also has a large number of specific test algorithms from which to choose. Therefore, it is now a rather significant endeavor to design a memory system with BIST.

The level of this effort is significantly reduced, and the required skill level of the designer reduced, by the aspect of the present invention that provides a database from which a specific combination of memory and BIST is selected and specific interconnections between them easily made. This concept is shown in one form in FIG. 8 wherein selected data 121 for a memory block is combined with data 123 defining an appropriate form of BIST interface circuitry for a chosen memory block. Interconnections between data 121 and 123 are defined, any functional parameters within the BIST interface data 123 are selected, and external connections of a resulting memory module 125 are defined.

Similarly, the BIST controller is formed of a number of functional blocks within the database. Specific data 127 is selected for the state machine to execute the desired test sequence. A file 129 is selected to provide the address sequence logic, and another file 131 for the read/write control logic. A fourth database file 133 is selected to perform the comparison between the bit data stream inputted to the memory and that which is outputted from the memory.

Interconnections between these four files are defined, any necessary parameters set, and external connections to the BIST controller 135 specified. Connections between one or more memory modules 125 and one or more BIST controllers 135 can then easily be defined in a database format.

It is often desired to include a capability of testing the completed integrated circuit database to make sure that the circuit is going to function as designed. For that purpose, test vector data 137 may be similarly generated from component block data, such as test driver data 139 and test observer data 141. The software test vector database file 137 is then interconnected with the memory modules 125 and disk controllers 135 to provide a software test capability. The test vector data 137 is then eliminated when the completed database is finalized for manufacturing the integrated circuit.

A software tool provides the capability of combining individual circuit portion data in a hierarchical manner. This is what has been described with respect to FIG. 8, and is shown in a slightly different way in FIG. 9. The individual memory modules 125 are formed from data defining a memory block 121 and data defining a BIST interface circuit 123, as previously described. In addition, data 143 defines the interconnections between the "pins" of the memory block 121 and BIST interface 123. Connect data 143 also defines external connection "pins" of the memory module, which are then interconnected with the controller 135 and stimulus block 137 by top level connect data 153. In forming the data for the controller 135, appropriate connect data 145, 147 and 149 are also provided for the same purpose as connect data 143 in the memory module. Similar connect data 151 is used to form the stimulus data 137. If the integrated circuit chip being designed is quite large and/or complex, what is shown in FIG. 9 can be repeated for another portion of the circuit, with yet higher level connect data being provided to define interconnections between what is shown in FIG. 9 and another similar portion of the circuit.

The methodology of the software tool to combine the various conductivity data (information) in the memory block and BIST interface as a physical schematic diagram is illustrated in FIG. 10 to implement a memory module previously described with respect to FIG. 2. Functional data for the memory block includes a definition of the external connections shown. Similarly, BIST interface data includes a definition of its external connections that are also included in FIG. 10. The connect data 143 (FIG. 9) specifies interconnections between the external connections of the memory block at a periphery 155 and the external connections of the BIST interface at a periphery 157. The connect data 143 also defines the external connections of a resulting memory module, around a periphery 159. This resulting module can be referred to as a "parent" of the memory and BIST interface blocks. A similar parent module is developed for the controller from its component blocks, and for the stimulus module from its component blocks. The connect data 153 then specifies how the external connections of the parent modules are interconnected with each other.

The providing of the interconnection data separate from the various block data provides a significant advantage. It allows interconnections between available block data to be made without having to significantly modify such data. The connect data overlie the circuit block description data and work with it to specify an overall circuit but do not require modification of the circuit block data in order to effect such interconnections. The connect data are established as library files, along with the circuit block data, by a highly skilled designer. But once in the library, they can be used to design specific integrated circuit memory systems by a designer that does not possess such a high level of skill. The library can include a BIST scheme that implements the test algorithm described above, and others. Further, such specific integrated circuits can be designed a much less time than before.

Specific operation of the software tool which combines circuit block data and connect data in a manner described above, is shown in FIG. 11. The software tool maintains a list of terms which are used in various circuit block and connect databases in a library of files from which a specific integrated circuit is formed. In a first step 161, this term data is read. Also, certain terms are available for use by the user to specify the types of circuit blocks that are to be chosen from the library and combined, a list of terms available for this user data is also separately maintained.

Once the block description data are read, in a next step 163, all of the circuit block files and connect files from the library are read. The software tool then, in a step 165, compares the terms of the libraries with the list of keywords in the block description read in step 161. If there is some inconsistency, the processing ends, as indicated at 167, with the posting of an error message for the user. If there is no inconsistency, the processing proceeds to a step 169 where the user input data is read. That user data is then compared, in a step 171, with terms in the block description read in step 161 that are properly included in the user data. If there is any inconsistency in these terms, processing proceeds to the termination step 167. However, if there is consistency, then a processing proceeds to a next step 173.

The step 173 establishes a hierarchy of the data to be combined from the libraries such as the hierarchy illustrated in FIG. 9 for a memory system with BIST. It is specified, for example, that memory block and BIST interface databases are to be combined with appropriate connect data to form apparent memory module data. The components of the parent test controller data are also specified. The next several steps in the processing then combine this data in that way. In a step 175, for example, a particular memory block database specified by the designer in the user data is combined with a BIST interface database that is also specified by the designer in the user data. Connect data that is linked to the selected BIST interface data is also accessed. Internal interconnections between the blocks are defined and external connections of the parent module are specified. A next step 177 then analysis the resulting interconnections to see if there are any inconsistencies. If there are, the processing ends in a step 167. If there are no inconsistencies, a step 179 actually makes the interconnections and sets any necessary parameters specified by the designer in the user data.

In a step 181, it is determined whether all the parent data have been formed. If not, the steps 175, 177 and 179 are repeated for the next parent data. For example, this can be for the controller module, followed by the same processing to form the stimulus module. After all such parents are formed, the processing proceeds to a step 183 where control data are generated, and then to a step 185 where this control data and all of the interconnected circuit block data are outputted.

The interconnected circuit block data files are then used with available software tools and procedures to develop integrated circuit masks from which the integrated circuits are manufactured on semiconductor wafers. If the individual circuit block data files in the library being used are expressed in a high level functional manner, such as by a standard Verilog or VHDL format, then the output of the software tool being described will also be in that format. It is standard to proceed from data files in that format to the specific mask and other tools used to manufacture the circuits.

Although the various aspects of the invention have been described with respect to their preferred embodiments, it will be understood that the invention is to be protected in the full scope of the appended claims.

It is claimed:

1. A method of forming a database that defines an integrated circuit having a memory with test circuitry associated therewith, comprising:

provideing a plurality of databases that individually define a functional operation of a circuit block and its external connections, including one or more such databases for each of a memory circuit block, a built in self test (BIST) interface to the memory circuit block, and a plurality of BIST controller blocks, the providing of the plurality of databases including maintaining in separate files portions of the individual databases that define the functional operation of the circuit block and its external connections, identifying a type of memory circuit block to be utilized, and thereby to identify one of the plurality of databases that defines a memory block of the identified type, selecting a BIST interface to be combined with the memory circuit block, and thereby to select one of the plurality of databases that defines the selected BIST interface, defining a memory module by designating (a) interconnections between the external circuit block connections of the identified memory database and the identified BIST interface database, and (b) external connections of the memory module, identifying two or more of the plurality of BIST controller blocks to be combined to form a BIST controller, and thereby to identify two or more of the plurality of databases that define BIST controller blocks, defining the BIST controller by designating (a) interconnections between the external circuit block connections of the identified two or more databases that define BIST controller modules, and (b) external connections of the BIST controller, wherein the defining of the memory module and the defining of the BIST controller include using the files of external block connections without any substantial modification to the files that define the functional operation of the circuit blocks, and designating interconnections between the defined memory module and the defined BIST controller, thereby to form a database that defines an integrated circuit having a memory with test circuitry associated therewith.

2. The method according to claim 1, wherein the providing of a plurality of databases includes providing a plurality of software test vector blocks, the method further comprising:

identifying two or more of the plurality of software test vector blocks to be combined to form a test vector module, and thereby to identify two or more of the plurality of databases that define the test vector module, defining the test vector module by designating (a) interconnections between the external circuit block connections of the identified two or more databases that define test vector blocks, and (b) external connections of the test vector module, and designating interconnections between the defined test vector module and both the defined memory module and the defined BIST controller.

3. The method according to claim 1 wherein the defining of the memory module and the defining of the BIST controller are both accomplished automatically by software processing.

* * * * *